(12) United States Patent
Hsu et al.

(10) Patent No.: US 8,304,865 B2
(45) Date of Patent: Nov. 6, 2012

(54) LEADFRAME AND CHIP PACKAGE

(75) Inventors: Yueh-Chen Hsu, Taoyuan County (TW);
Mei-Lin Hsieh, Taoyuan County (TW);
Chih-Hung Hsu, Taipei County (TW);
Kuang-Hsiung Chen, Taoyuan County (TW); Yi-Cheng Hsu, Taoyuan County (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 330 days.

(21) Appl. No.: 12/859,470

(22) Filed: Aug. 19, 2010

(65) Prior Publication Data
US 2011/0062567 A1   Mar. 17, 2011

Related U.S. Application Data

(60) Provisional application No. 61/243,153, filed on Sep. 16, 2009.

(30) Foreign Application Priority Data

Apr. 2, 2010  (TW) ................................ 99110391 A

(51) Int. Cl.
*H01L 23/495*   (2006.01)

(52) U.S. Cl. .......................... 257/666; 257/670; 438/123
(58) Field of Classification Search .................. 257/666, 257/670, E23.031; 438/123
See application file for complete search history.

(56) References Cited

U.S. PATENT DOCUMENTS

2001/0045631 A1* 11/2001 Kinsman ....................... 257/676
2011/0049685 A1*  3/2011 Park et al. ..................... 257/660

FOREIGN PATENT DOCUMENTS

CN           1197546 A        10/1998

OTHER PUBLICATIONS

Chinese First Examination Report of China Application No. 201010164499.1, dated Jan. 12, 2012.

* cited by examiner

*Primary Examiner* — Theresa T Doan
(74) *Attorney, Agent, or Firm* — J.C. Patents

(57) ABSTRACT

A leadframe including a die pad, leads, an outer frame, connecting bars and grounding bars is provided. Each of the grounding bars is suspended between two connecting bars by being connected with branches of the two connecting bars, such that the grounding bars are spaced by the die pad. The leadframe and the chip package of the present invention can permit a great design variation.

22 Claims, 12 Drawing Sheets

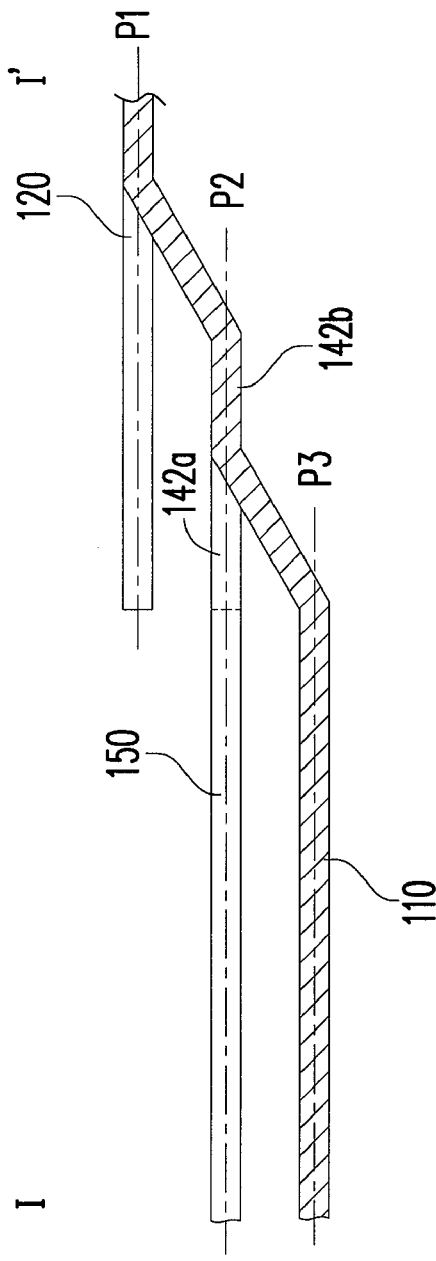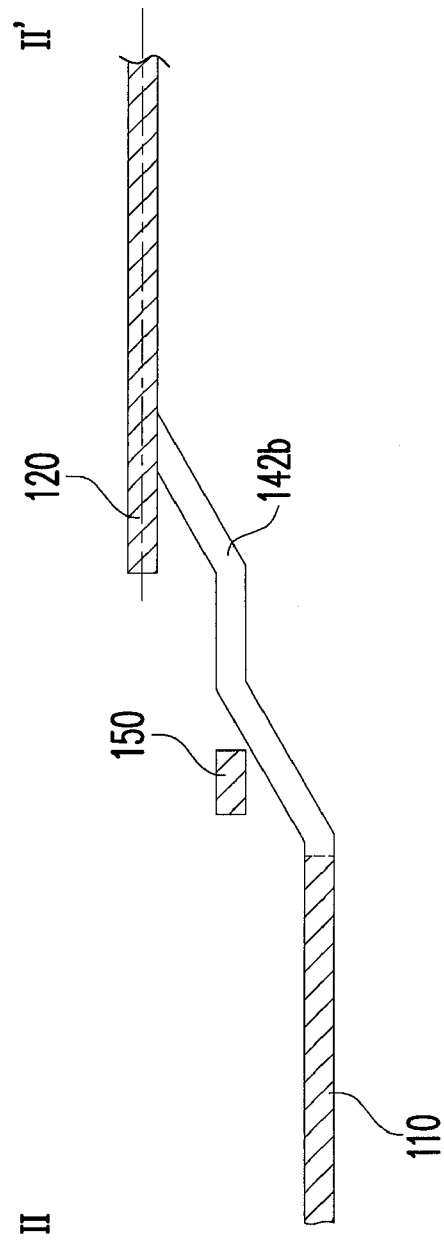

LEADFRAME AND CHIP PACKAGE

CROSS-REFERENCE TO RELATED APPLICATION

This application claims the priority benefit of U.S. provisional application Ser. No. 61/243,153, filed on Sep. 16, 2009. This application also claims the priority benefits of Taiwan application serial no. 99110391, filed on Apr. 2, 2010. The entirety of each of the above-mentioned patent applications is hereby incorporated by reference herein and made a part of this specification.

BACKGROUND OF THE INVENTION

1. Field of the Invention

The present invention relates to a leadframe and a chip package, and more particularly, the present invention relates to the leadframe having a die pad and a grounding bar spaced from each other and the chip package applying the same.

2. Description of Related Art

The production of IC devices can be mainly divided into three stages, including IC design, IC process and IC package. The package of IC devices comprises bonding chips formed by sawing a wafer onto a carrier and then encapsulating the chips by a molding compound to prevent the chip from influence of external temperature and humidity, and from contamination of dust, and may accomplish an electrical connection between the chip and external circuits.

Common carriers include leadframes and circuit substrates. Owing to superior heat dissipation effect, the leadframes are broadly used in chip package in the recent years. In a leadframe type chip package, a leadframe may comprises a die pad and a plurality of leads disposed around the die pad, wherein a chip is disposed on the die pad and electrically connected to the leads via plural conductive wires, and a molding compound is provided for encapsulating the chip and the conductive wires.

In the prior art, a chip may be grounded by being electrically connected to the die pad via conductive wires. However, a large reversed area on the die pad is required for grounded wire bonding, and thus design variation of the structure of the leadframe is restricted.

SUMMARY OF THE INVENTION

The present invention is directed to a leadframe permitting a great design variation.

The present invention is further directed to a chip package applying the aforementioned leadframe.

As embodied and broadly described herein, the present invention provides a leadframe including a die pad, a plurality of leads, an outer frame, a plurality of connecting bars and a plurality of grounding bars. The leads are disposed at a periphery of the die pad. The die pad and the leads are disposed inside the outer frame, and an end of each lead far away from the die pad is connected to the outer frame. Each connecting bar connected with the outer frame and provided with an end portion extending toward the die pad, wherein the end portion has a first branch, a second branch and a third branch parallel to one another, and the second branch located between the first branch and the third branch is connected with the die pad. The grounding bars are disposed between the die pad and the leads. Each of the grounding bars lies along an edge of the die pad and two adjacent connecting bars are spaced by one of the grounding bars, wherein two ends of the grounding bar are respectively connected to the first branch of one of the adjacent connecting bars and the third branch of the other of the adjacent connecting bars.

In an embodiment of the present invention, a width of each of the grounding bars is a constant.

In an embodiment of the present invention, a center portion of each of the grounding bars is bended.

In an embodiment of the present invention, a width of a center portion of each of the grounding bars is larger than a width of two ends of each of the grounding bars.

In an embodiment of the present invention, the die pad is located on a plane and a top surface of each of the grounding bars is inclined relative to the plane.

In an embodiment of the present invention, the grounding bars and the leads are located on a first plane, the die pad is located on a second plane, and the first plane and the second plane are parallels.

In an embodiment of the present invention, the leads are located on a first plane, the grounding bars are located on a second plane, the die pad is located on a third plane, the first plane, the second plane and the third plane are parallels, and the second plane is located between the first plane and the third plane.

According to an embodiment of the present invention, the die pad, the grounding bars and the leads are coplanar.

According to an embodiment of the present invention, each of the grounding bars and the die pad respectively have a first indentation and a second indentation facing each other at their adjacent sides.

In an embodiment of the present invention, each of the grounding bars has at least a through hole or an indentation.

In an embodiment of the present invention, the die pad is quadrangular, the grounding bars respectively lie along four sides of the die pad, and the connecting bars comprise four connecting bars respectively connected to four corners of the die pad.

The present invention further provides a chip package including a chip, a lead frame, a plurality of conductive wires and a molding compound. The leadframe includes a die pad, a plurality of leads, an outer frame, a plurality of connecting bars and a plurality of grounding bars. The leads are disposed at a periphery of the die pad. The die pad and the leads are disposed inside the outer frame, and an end of each lead far away from the die pad is connected to the outer frame. Each connecting bar connected with the outer frame and provided with an end portion extending toward the die pad, wherein the end portion has a first branch, a second branch and a third branch parallel to one another, and the second branch located between the first branch and the third branch is connected with the die pad. The grounding bars are disposed between the die pad and the leads. Each of the grounding bars lies along an edge of the die pad and two adjacent connecting bars are spaced by one of the grounding bars, wherein two ends of the grounding bar are respectively connected to the first branch of one of the adjacent connecting bars and the third branch of the other of the adjacent connecting bars. The chip is disposed on the die pad. The conductive wires are connected between the chip and the leads. The molding compound encapsulates the chip and the conductive wires.

In an embodiment of the present invention, a width of each of the grounding bars is a constant.

In an embodiment of the present invention, a center portion of each of the grounding bars is bended.

In an embodiment of the present invention, a width of a center portion of each of the grounding bars is larger than a width of two ends of each of the grounding bars.

In an embodiment of the present invention, the die pad is located on a plane and a top surface of each of the grounding bars is inclined relative to the plane.

In an embodiment of the present invention, the grounding bars and the leads are located on a first plane, the die pad is located on a second plane, and the first plane and the second plane are parallels.

In an embodiment of the present invention, the leads are located on a first plane, the grounding bars are located on a second plane, the die pad is located on a third plane, the first plane, the second plane and the third plane are parallels, and the second plane is located between the first plane and the third plane.

According to an embodiment of the present invention, the die pad, the grounding bars and the leads are coplanar.

According to an embodiment of the present invention, each of the grounding bars and the die pad respectively have a first indentation and a second indentation facing each other at their adjacent sides.

In an embodiment of the present invention, each of the grounding bars has at least a through hole or an indentation.

In an embodiment of the present invention, the die pad is quadrangular, the grounding bars respectively lie along four sides of the die pad, and the connecting bars comprise four connecting bars respectively connected to four corners of the die pad.

As embodied and broadly described herein, the present invention provides a leadframe including a die pad, a plurality of leads, an outer frame, a plurality of connecting bars and a plurality of grounding bars. The leads are disposed at a periphery of the die pad. The die pad and the leads are disposed inside the outer frame, and an end of each lead far away from the die pad is connected to the outer frame. Each of the connecting bars is connected between the outer frame and the die pad. The grounding bars are disposed between the die pad and the leads, wherein two adjacent connecting bars are spaced by one of the grounding bars, each of the grounding bars lies along an edge of the die pad, and two ends of the grounding bar respectively extend along the two adjacent connecting bars toward the outer frame and connects to the connecting bars.

The present invention further provides a leadframe including a die pad, a plurality of leads, an outer frame and a plurality of connecting bars. The leads are disposed at a periphery of the die pad. The die pad and the leads are disposed inside the outer frame, and an end of each lead far away from the die pad is connected to the outer frame. Each of the connecting bars is connected between the outer frame and the die pad, the die pad has a plurality of slits extending along an edge thereof and separating the die pad into a carrying portion and a plurality of grounding portions disposed at the periphery of the carrying portion, and two ends of each of the slits further extends onto the corresponding connecting bars for suspending each of the grounding portions between the corresponding bars.

As to the above, each of the grounding bars of the present invention is suspended between two connecting bars by being connected with branches of the two connecting bars, such that the grounding bars are separated from the die pad. The leadframe and the chip package of the present invention can permit a great design variation.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention.

FIG. 4B is a cross-sectional view of the leadframe taken along Line I-I' in FIG. 4A.

FIG. 4C is a cross-sectional view of the leadframe taken along Line II-II' in FIG. 4A.

DESCRIPTION OF EMBODIMENTS

Figure 1A:
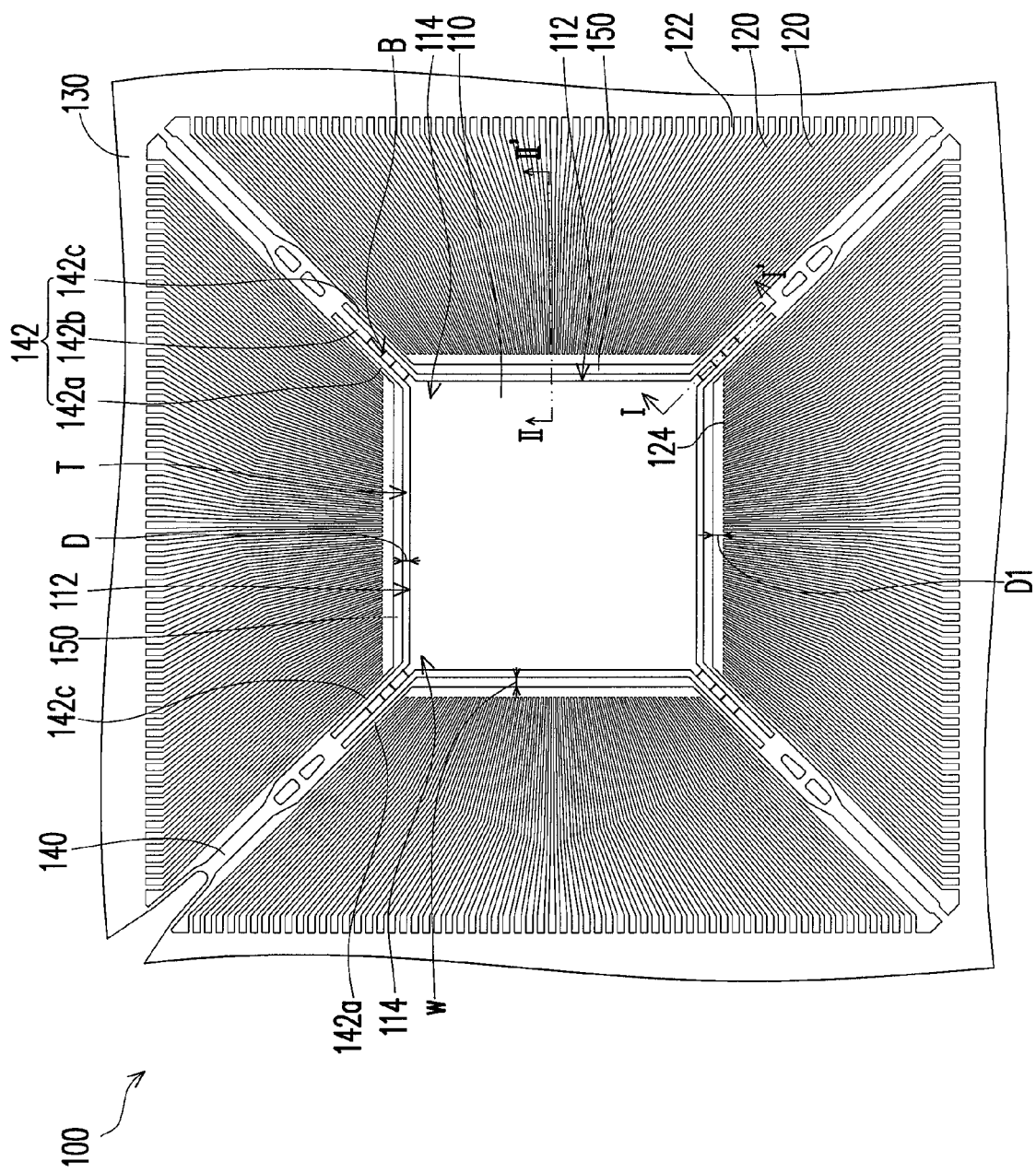
FIG. 1A is a top view schematically illustrating a leadframe according to an embodiment of the present invention.

FIG. 1A is a top view schematically illustrating a leadframe according to an embodiment of the present invention. Referring to FIG. 1A, a leadframe 100 comprises a die pad 110, a plurality of leads 120, an outer frame 130, a plurality of connecting bars 140 and a plurality of grounding bars 150. The leads 120 are disposed at a periphery of the die pad 110, and the die pad 110 and the leads 120 are disposed in the outer frame 130, wherein an end 122 of each leads 120 far away from the die pad 110 is connected with the outer frame 130, and another end 124 of each leads 120 is a free end.

Each of the connecting bars 140 is connected with the outer frame 130 and provided with an end portion 142 extending toward the die pad 110. The end portion 142 has a first branch 142a, a second branch 142b and a third branch 142c parallel to one another, and the second branch 142b located between the first branch 142a and the third branch 142c is connected with the die pad 110.

Each of the grounding bars 150 lies along an edge 112 of the die pad 110, and the grounding bars 150 are located between the die pad 110 and the ends 124 of the leads 120. Two adjacent connecting bars 140 are spaced by a grounding bar 150, wherein two ends of the grounding bar 150 are respectively connected to the first branch 142a of one of the connecting bars 140 and the third branch 142c of the other of the connecting bars 140. In other words, two ends of the grounding bar 150 extend along the two corresponding connecting bars 140 toward the outer frame 130, and then respectively connect the corresponding connecting bars 140.

In another aspect, the die pad 110 has a plurality of slits T extending along an edge thereof and separating the die pad 110 into a carrying portion (i.e. the main body of the die pad 110) and a plurality of grounding portions (i.e. the grounding bars 150) disposed at the periphery of the carrying portion, and two ends of each of the slits T further extends onto the corresponding connecting bars 140 for suspending each of the grounding portions between the corresponding bars 140.

In the illustrated embodiment, the die pad 110 is quadrangular, and four grounding bars 150 are provided to respectively lie along four sides 112 of the die pad 110. Particularly, the four grounding bars 150 are spaced from their corresponding sides 112 by a distance D. In addition, the connecting bars 140 is embodies as four connecting bars 140 respectively connected to four corners 114 of the die pad 110.

In the illustrated embodiment, each of the grounding bars 150 is connected between the first branch 142a of one of the connecting bars 140 and the third branch 142c of the other of the connecting bars 140, so as to suspend each of the grounding bars 150 between two corresponding connecting bars 140 and separate the grounding bars from the die pad 110. Thereby, the grounding bars 150 and the die pad 110 of the leadframe 110 can be configured according to practical requirements, and great design variation of the structure of the leadframe 110 can be achieved. In addition, the grounding bars 150 are spaced from the die pad 110 by the distance D. Therefore, as applying the leadframe 100 of this embodiment to a chip package, a molding compound can be filled in to the slit T between the grounding bars 150 and the die pad 110, so as to efficiently encapsulate the grounding bars 150 and separate the grounding bars 150 from the die pad 110. In addition, delamination between the grounding bars 150 and the molding compound can be effectively prevented, so as to improve the processing yields and the reliability of the chip package.

Figure 1B:
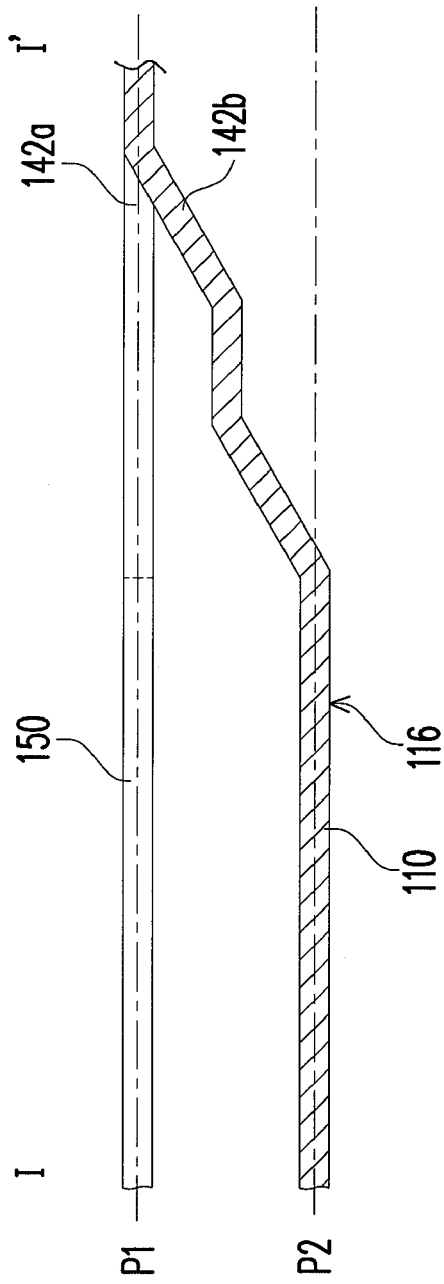
FIG. 1B is a cross-sectional view of the leadframe taken along Line I-I' in FIG. 1A.
Figure 1C:
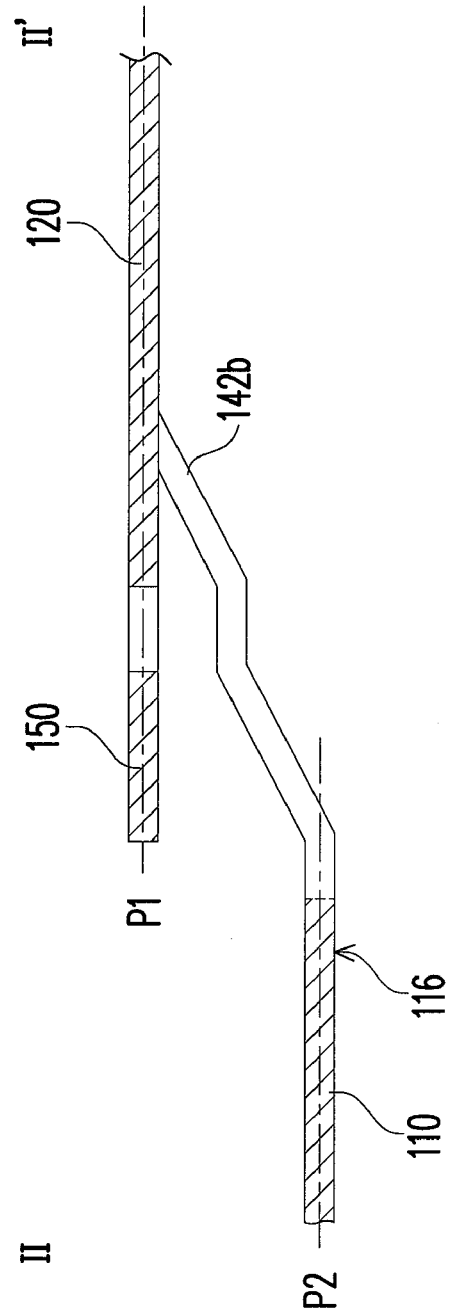
FIG. 1C is a cross-sectional view of the leadframe taken along Line II-II' in FIG. 1A.

FIG. 1B is a cross-sectional view of the leadframe taken along Line I-I' in FIG. 1A. FIG. 1C is a cross-sectional view of the leadframe taken along Line II-II' in FIG. 1A. Referring to FIGS. 1B and 1C, the grounding bars 150 and the leads 120 are located on a first plane P1, the die pad 110 is located on a second plane P2, and the first plane P1 and the second plane P2 are parallels.

Specifically, the second branch 142b in this embodiment is provided with a down-set configuration whereby crease lines B are formed on the second branch 142b and the die pad 110 is located below the grounding bars 150 and the leads 120. The down-set configuration is beneficial to the subsequent wire bonding process and may further exposes a bottom surface 216 of the die pad 110 out of the molding compound (not shown) in the subsequent package process.

It can be noted that each of the connecting bars 140 of this embodiment has the first branch 142a, the second branch 142b and a third branch 142c, and the relative positions of the die pad 110, the grounding bars 150 and the leads 120 can be regulated by forming the first branch 142a, the second branch 142b and a third branch 142c, alone or in combination, with the down-set configuration or by other applicable fabricating process. Since each of the first branch 142a, the second branch 142b and a third branch 142c can be individually configured, the leadframe 100 of the embodiment permits a great design variation.

Figure 2:
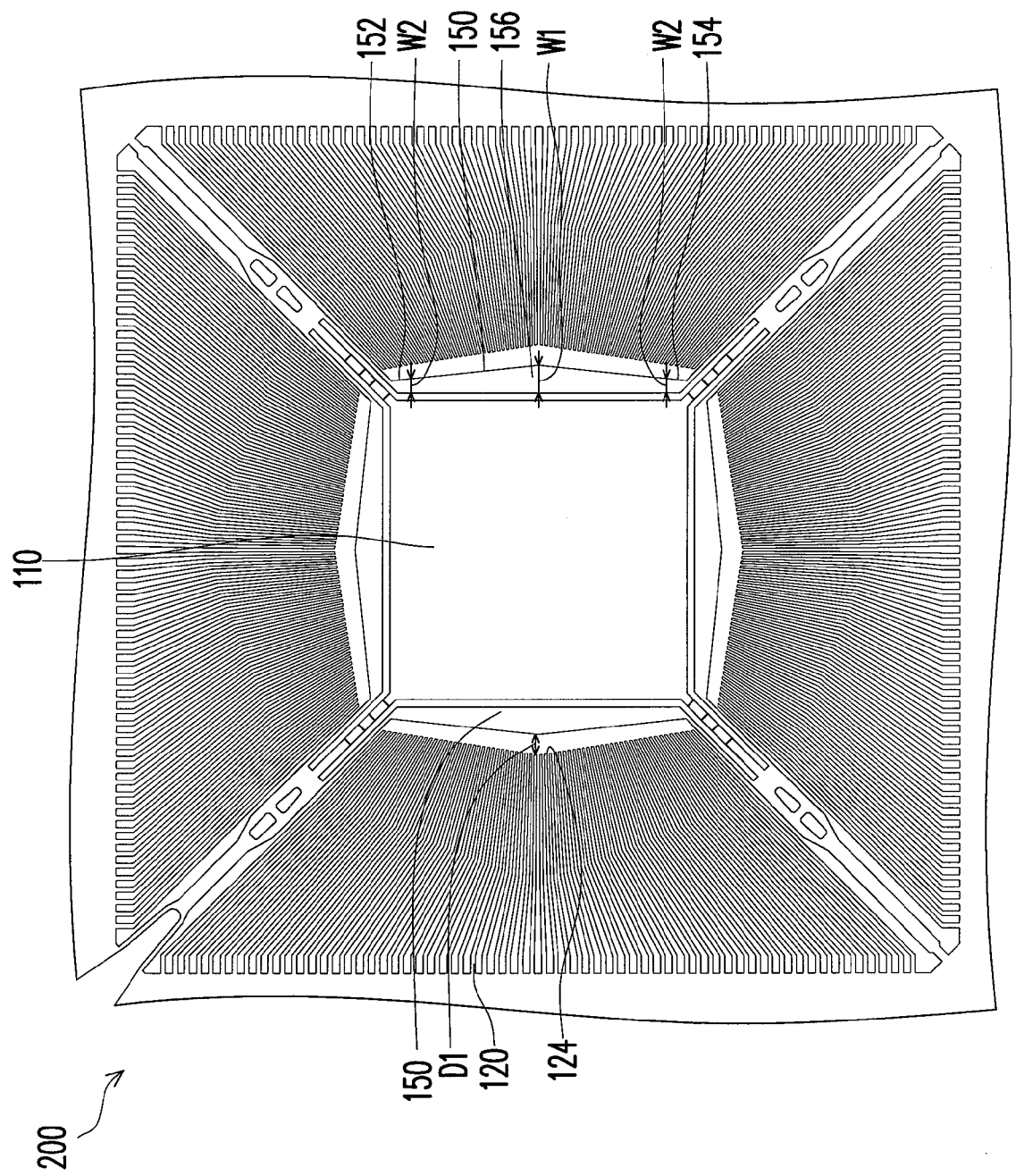
FIG. 2 is a top view schematically illustrating a leadframe according to another embodiment of the present invention.
Figure 3:
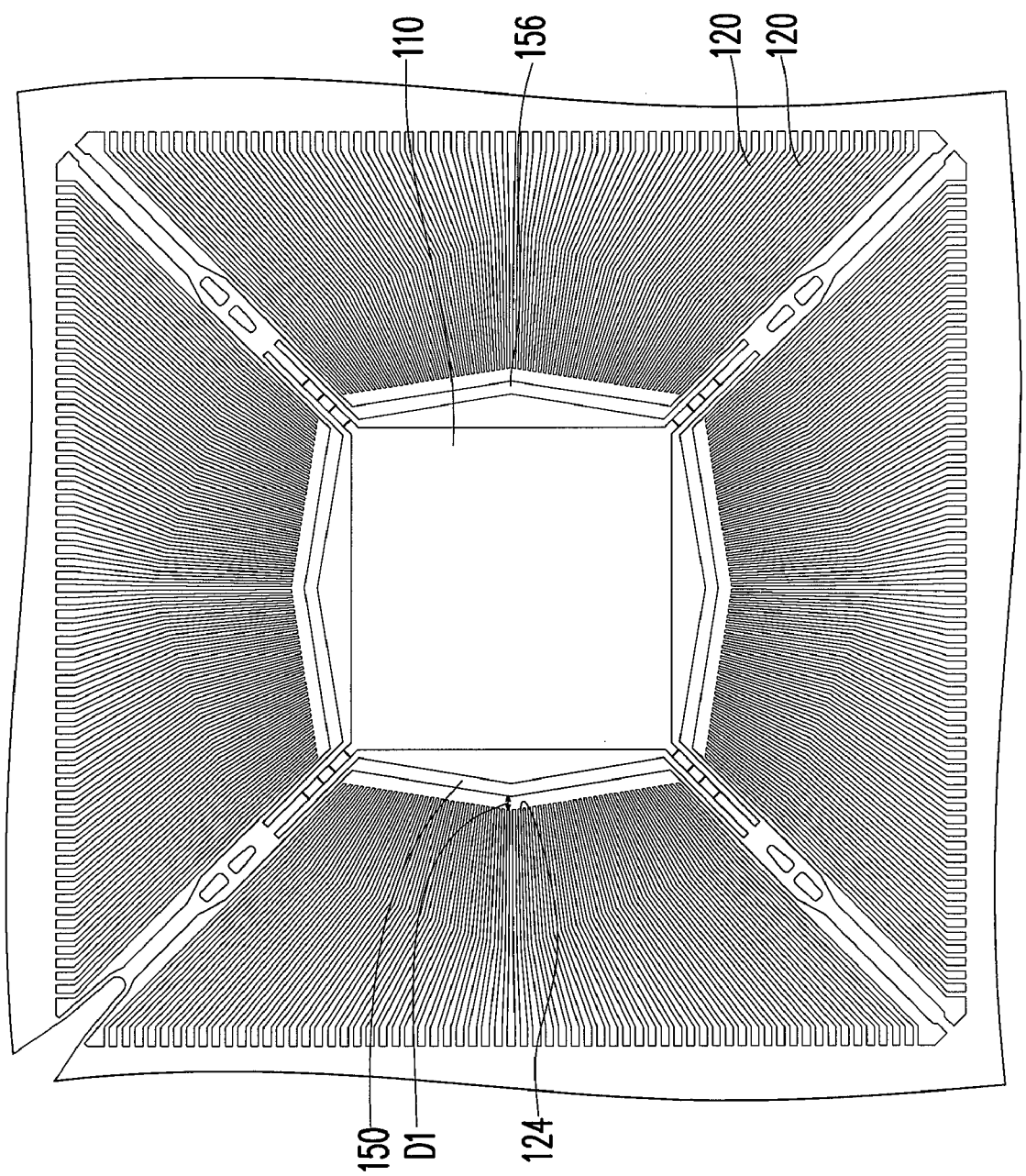
FIG. 3 is a top view schematically illustrating a leadframe according to further another embodiment of the present invention.

As shown in FIG. 1A, a width W of each of the grounding bars 150 is a constant. FIG. 2 is a top view schematically illustrating a leadframe according to another embodiment of the present invention. Referring to FIG. 2, a width W1 of a center portion 156 of each of the grounding bars 150 is larger than a width W2 of two ends 152 and 154 of each of the grounding bars 150. FIG. 3 is a top view schematically illustrating a leadframe according to further another embodiment of the present invention. Referring to FIG. 3, a center portion 156 of each of the grounding bars 150 is bended. According to FIGS. 1A, 2 and 3, it is noted that no matter what the shape of the grounding bars 150 will be, the grounding bars 150 are kept from an end of each of the leads 120 extending toward the die pad 110 in a distance D1.

Figure 4A:
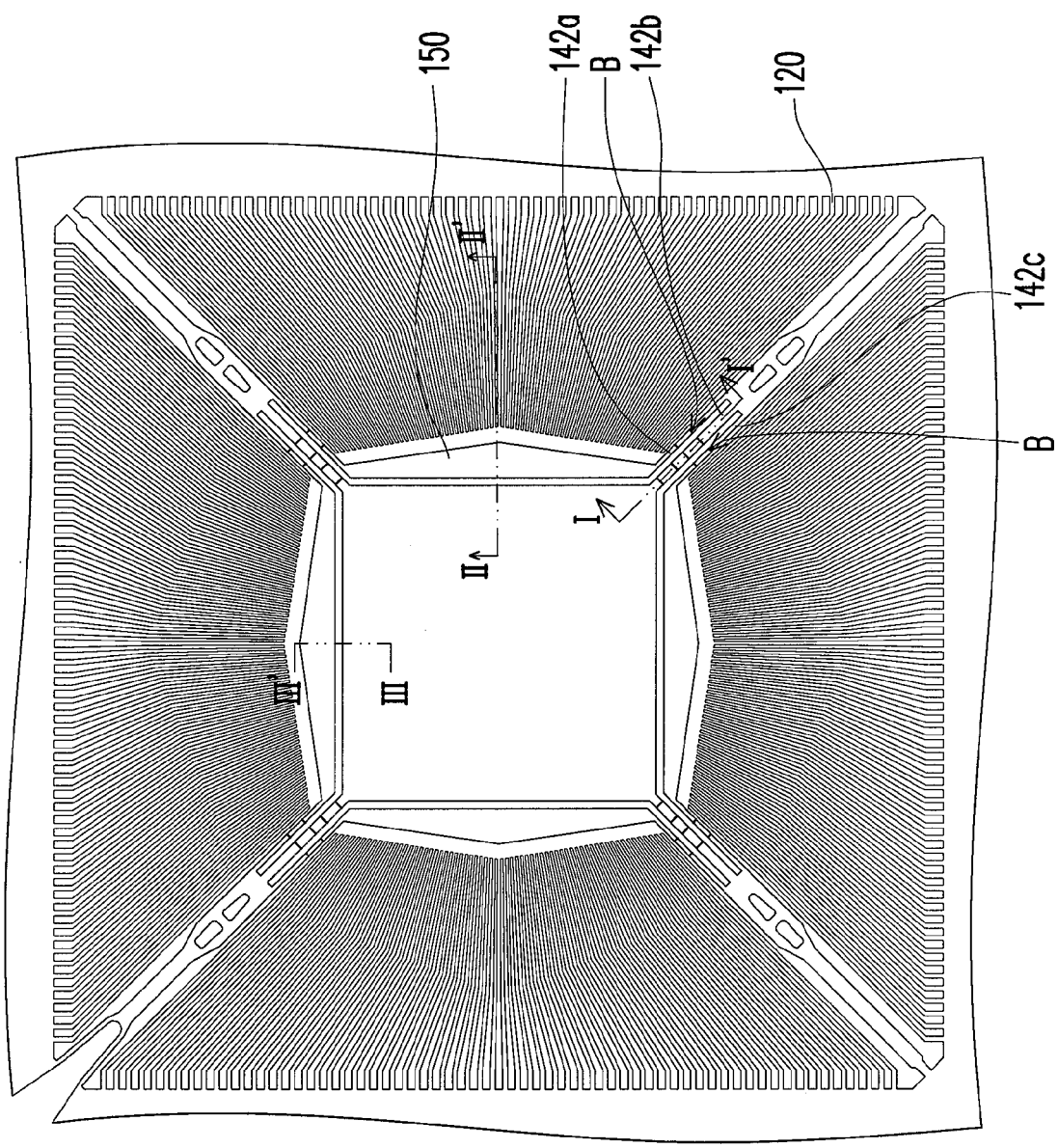
FIG. 4A is a top view schematically illustrating a leadframe according to an embodiment of the present invention.

FIG. 4A is a top view of a leadframe according to an embodiment of the present invention. FIG. 4B is a cross-sectional view of the leadframe of FIG. 4A along lines I-I'. FIG. 4C is a cross-sectional view of the leadframe of FIG. 4A along lines II-II'. Referring to FIGS. 4A, 4B and 4C, the leadframe 400 of this illustrated embodiment is almost similar to the leadframe 200 in FIG. 2 except that the leads 120 of the leadframe 400 are located on a first plane P1, the grounding bars 150 are located on a second plane P2, the die pad 110 is located on a third plane P3, the first plane P1, the second plane P2 and the third plane P3 are parallels, and the second plane P2 is located between the first plane P1 and the third plane P3.

In other words, the first branch 142a, the second branch 142b and the third branch 142c of the embodiment are in down-set configuration so as to form crease lines B on the first branch 142a, the second branch 142b and the third branch 142c, and thereby the leads 120, the grounding bars 150 and the die pad 110 are located in different planes.

Figure 4D:
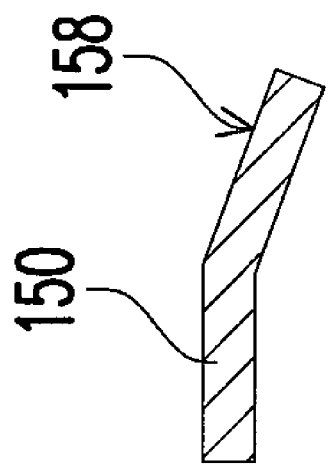
FIG. 4D is a cross-sectional view of the leadframe taken along Line III-III' in FIG. 4A.
Figure 4D:
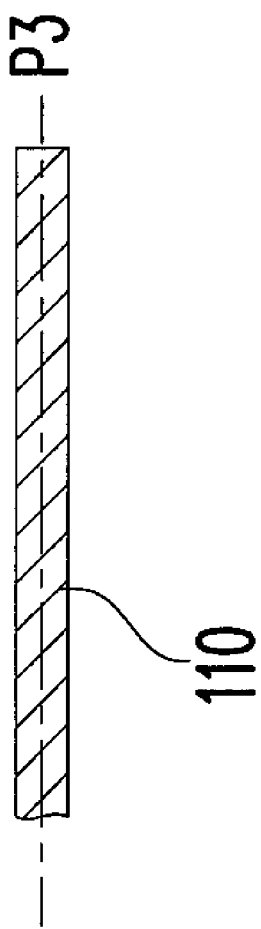

FIG. 4D is a cross-sectional view of the leadframe taken along Line III-III' in FIG. 4A. Referring to FIG. 4D, a top surface 158 of each of the grounding bars 150 is inclined relative to the third plane P3.

Figure 5:
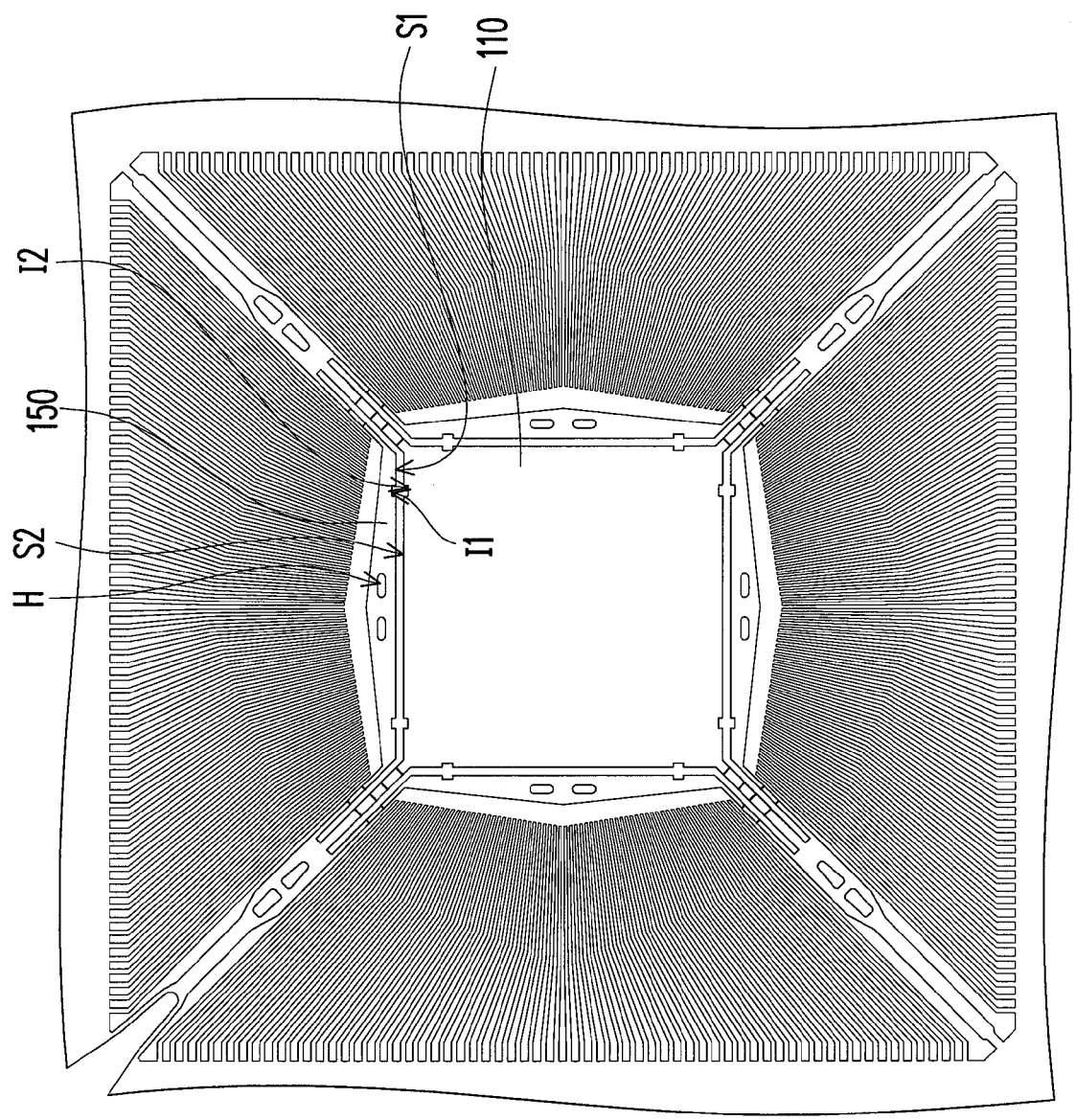
FIG. 5 is a top view schematically illustrating a leadframe according to another embodiment of the present invention.
Figure 6:
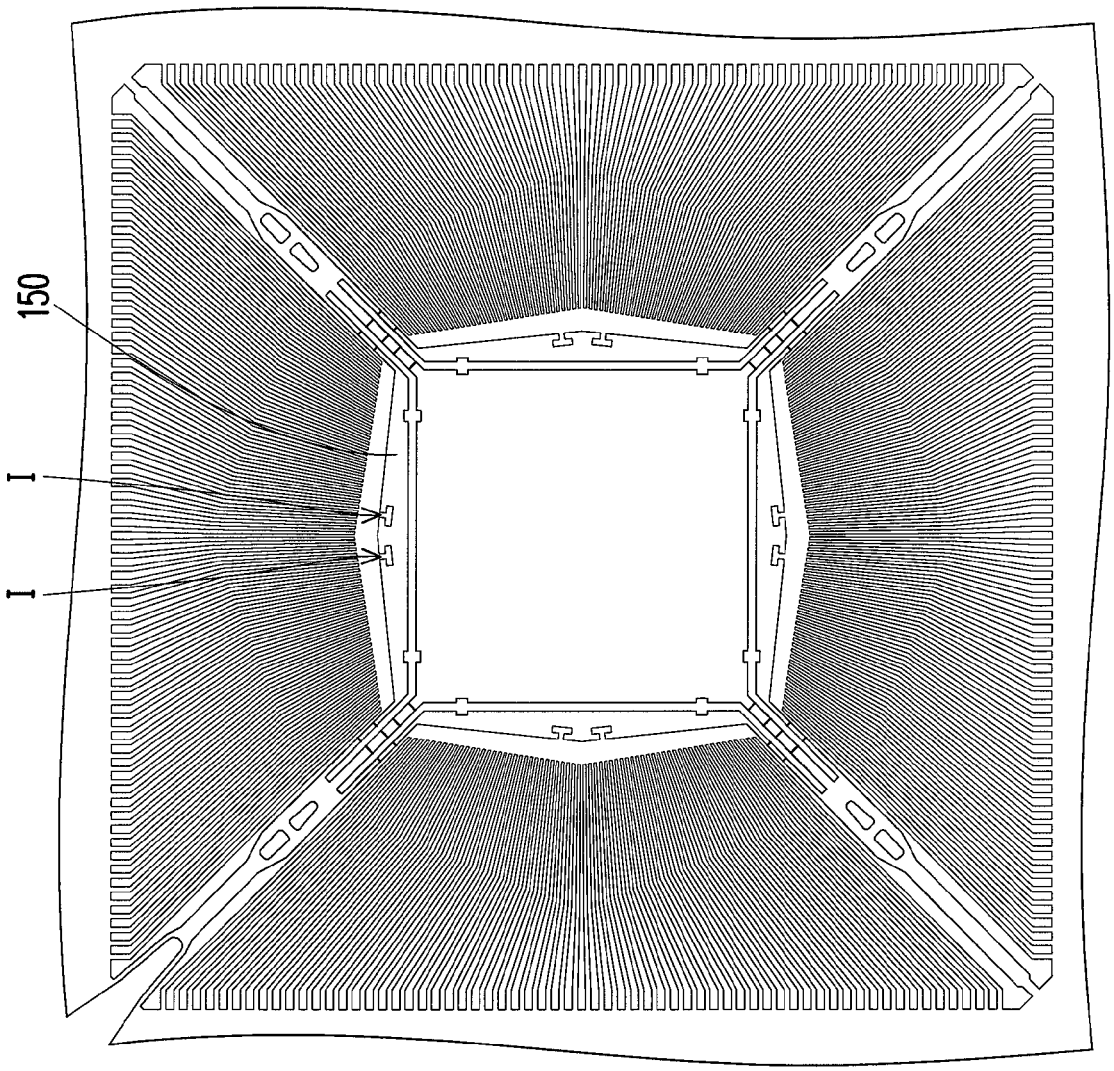
FIGS. 6 and 7 are top views respectively illustrating two types of leadframe according to further other embodiments of the present invention.
Figure 7:
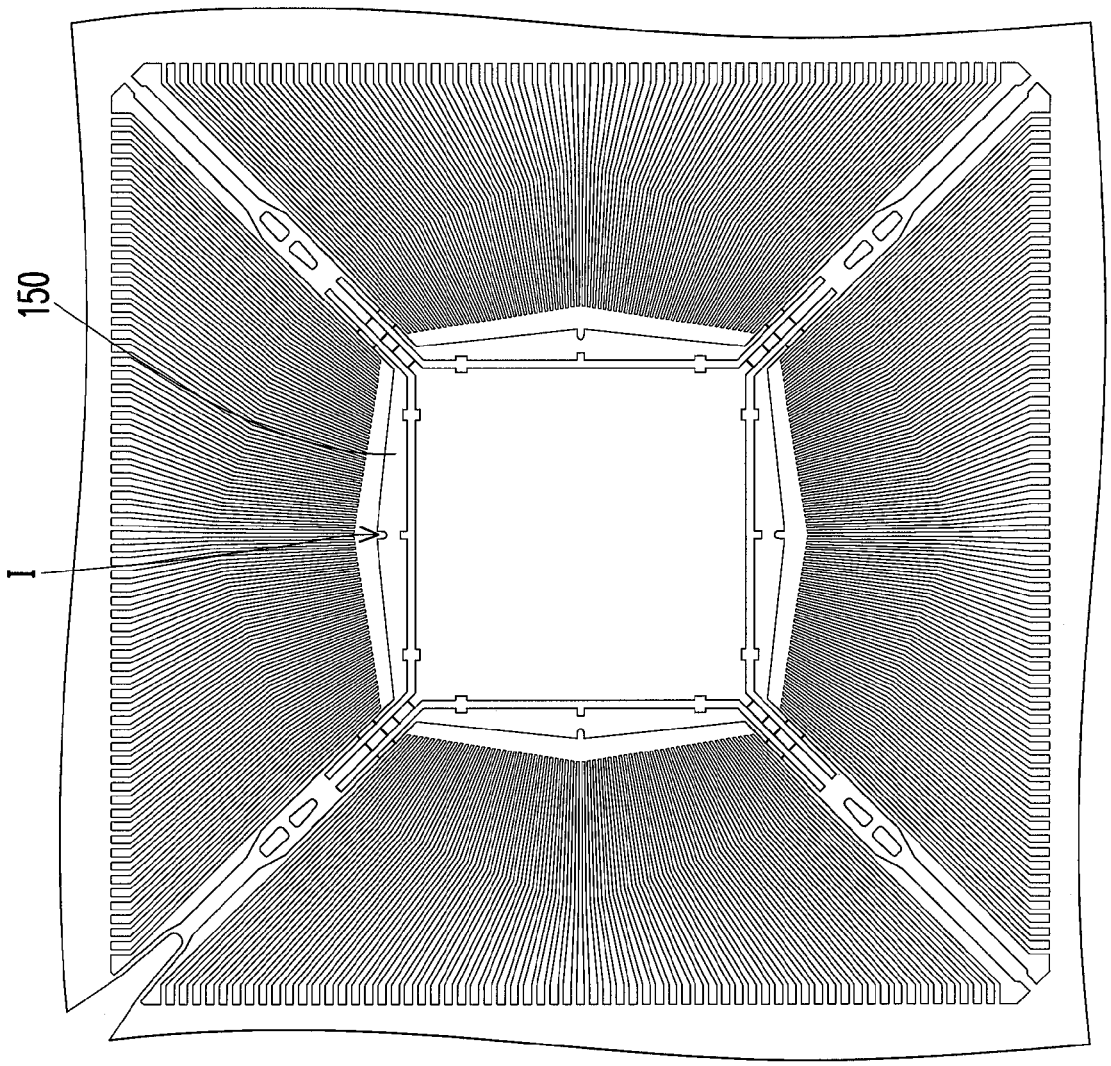

FIG. 5 is a top view schematically illustrating a leadframe according to another embodiment of the present invention. Referring to FIG. 5, each of the grounding bars 150 and the die pad 110 respectively have a first indentation I1 and a second indentation I2 facing each other at their adjacent sides S1 and S2. Furthermore, each of the grounding bars 150 may have a plurality of through holes H. FIGS. 6 and 7 are top views respectively illustrating two types of leadframe according to further other embodiments of the present invention. Referring to FIGS. 6 and 7, each of the grounding bars 150 has a plurality of indentations I. It is noted that in the subsequent package process, the indentations I, I1, I2 and the holes H can improve the bondibility between the grounding bars 150 and the molding compound (not shown).

Figure 8A:
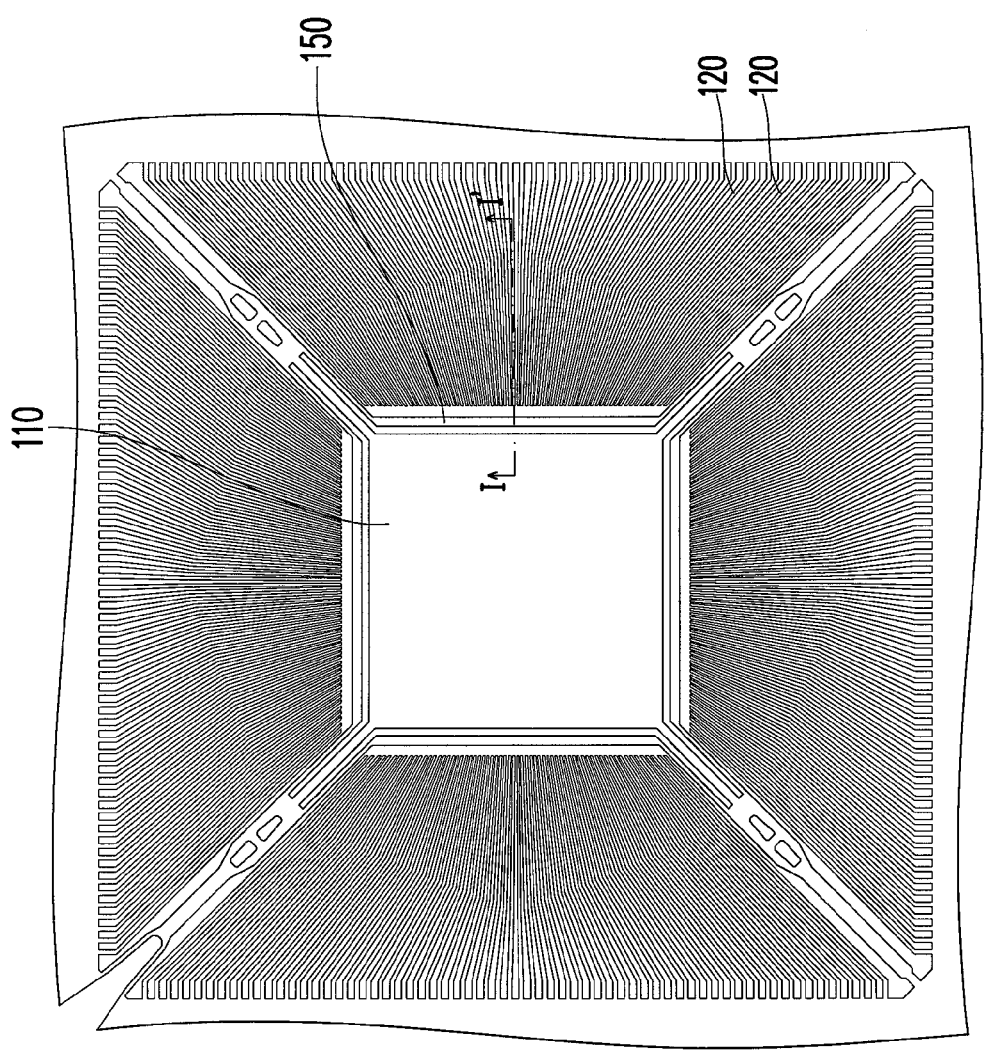
FIG. 8A is a top view schematically illustrating a leadframe according to an embodiment of the present invention.
Figure 8B:
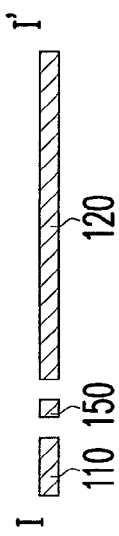
FIG. 8B is a cross-sectional view of the leadframe taken along Line I-I' in FIG. 8A.

FIG. 8A is a top view schematically illustrating a leadframe according to an embodiment of the present invention. FIG. 8B is a cross-sectional view of the leadframe taken along line I-I' in FIG. 8A. Referring to FIGS. 8A and 8B, the leadframe 800 of the illustrated embodiment is almost similar to the leadframe 100 in FIG. 1 except that the die pad 110, the grounding bars 150 and the leads 120 of the leadframe 800 are coplanar.

Figure 9:
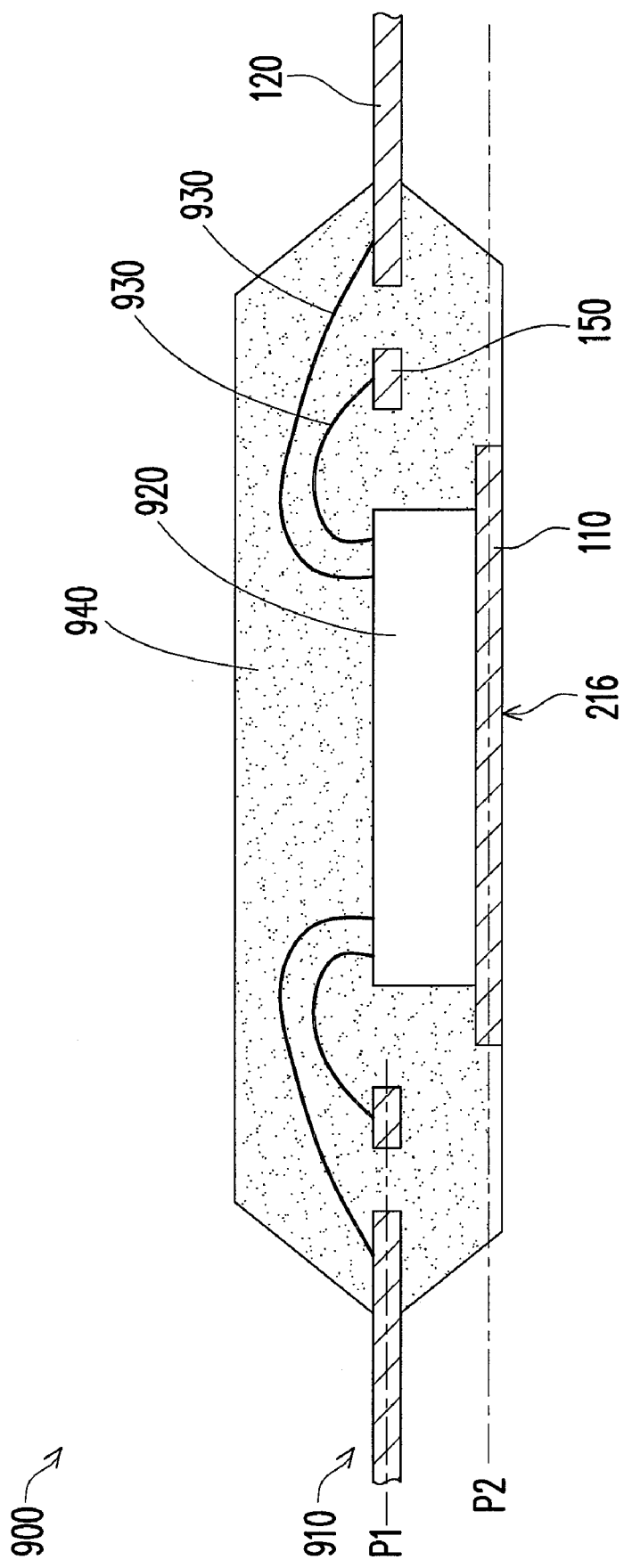
FIG. 9 is a cross-sectional view illustrating a chip package according to an embodiment of the invention.

FIG. 9 is a cross-sectional view illustrating a chip package according to an embodiment of the invention. Referring to FIG. 9, the chip package structure 900 of the present embodiment includes a leadframe 910, a chip 920, a plurality of conductive wires 930, and a molding compound 940. It should be noted that the leadframe 910 of the present embodiment can be to the leadframes 100 in FIGS. 1A through 1C, and thus not repeated herein. Moreover, in other embodiments, the leadframe 910 can be replaced by the leadframes illustrated in FIGS. 2 through 8B. The chip 920 is disposed on the die pad 110, and the conductive wires 930 are connected between the chip 920 and the leads 120 and between the chip 920 and the grounding bars 150. The molding compound 940 encapsulates the chip 920 and the conductive wires 930.

In this embodiment, since the chip pad 110 is located below the leads 120 and the grounding bars 150, the bottom surface 216 of the die pad 110 can be exposed by the molding compound 940. Thereby, heat generated by the chips 920 can be conducted to the external circumstance through the die pad 110.

In summary, each of the grounding bars of the present invention is suspended between two connecting bars by being connected with branches of the two connecting bars, such that the grounding bars are separated from the die pad. The leadframe and the chip package of the present invention can permit a great design variation.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A leadframe, comprising:
   a die pad;
   a plurality of leads disposed at a periphery of the die pad;
   an outer frame, wherein the die pad and the leads are disposed inside the outer frame, and an end of each lead far away from the die pad is connected to the outer frame;
   a plurality of connecting bars, wherein each connecting bar is connected with the outer frame and provided with an end portion extending toward the die pad, the end portion has a first branch, a second branch and a third branch parallel to one another, and the second branch located between the first branch and the third branch is connected with the die pad; and
   a plurality of grounding bars, disposed between the die pad and the leads, wherein each of the grounding bars lies along an edge of the die pad, two adjacent connecting bars are spaced by one of the grounding bars, and two ends of the grounding bar are respectively connected to the first branch of one of the adjacent connecting bars and the third branch of the other of the adjacent connecting bars.

2. The leadframe as claimed in claim 1, wherein a width of each of the grounding bars is a constant.

3. The leadframe as claimed in claim 1, wherein a center portion of each of the grounding bars is bended.

4. The leadframe as claimed in claim 1, wherein a width of a center portion of each of the grounding bars is larger than a width of two ends of each of the grounding bars.

5. The leadframe as claimed in claim 1, wherein the die pad is located on a plane and a top surface of each of the grounding bars is inclined relative to the plane.

6. The leadframe as claimed in claim 1, wherein the grounding bars and the leads are located on a first plane, the die pad is located on a second plane, and the first plane and the second plane are parallels.

7. The leadframe as claimed in claim 1, wherein the leads are located on a first plane, the grounding bars are located on a second plane, the die pad is located on a third plane, the first plane, the second plane and the third plane are parallels, and the second plane is located between the first plane and the third plane.

8. The leadframe as claimed in claim 1, wherein the die pad, the grounding bars and the leads are coplanar.

9. The leadframe as claimed in claim 1, wherein each of the grounding bars and the die pad respectively have a first indentation and a second indentation facing each other at their adjacent sides.

10. The leadframe as claimed in claim 1, wherein each of the grounding bars has at least a through hole or an indentation.

11. The leadframe as claimed in claim 1, wherein the die pad is quadrangular, the grounding bars respectively lie along four sides of the die pad, and the connecting bars comprise four connecting bars respectively connected to four corners of the die pad.

12. A chip package, comprising:
    a lead frame, comprising:
      a die pad;
      a plurality of leads disposed at a periphery of the die pad;
      a plurality of connecting bars disposed at the periphery of the die pad, wherein each connecting bar has an end portion extending toward the die pad, the end portion has a first branch, a second branch and a third branch parallel to one another, and the second branch located between the first branch and the third branch is connected with the die pad;
      a plurality of grounding bars, disposed between the die pad and the leads, wherein each of the grounding bars lies along an edge of the die pad, two adjacent connecting bars are spaced by one of the grounding bars, and two ends of the grounding bar are respectively connected to the first branch of one of the adjacent connecting bars and the third branch of the other of the adjacent connecting bars;
    a chip disposed on the die pad;
    a plurality of conductive wires electrically connected between the chip and the leads and between the chip and the grounding bars; and
    a molding compound encapsulating the chip and the conductive wires.

13. The chip package as claimed in claim 12, wherein a width of each of the grounding bars is a constant.

14. The chip package as claimed in claim 12, wherein a center portion of each of the grounding bars is bended.

15. The chip package as claimed in claim 12, wherein a width of a center portion of each of the grounding bars is larger than a width of two ends of each of the grounding bars.

16. The chip package as claimed in claim 12, wherein the die pad is located on a plane and a top surface of each of the grounding bars is inclined relative to the plane.

17. The chip package as claimed in claim 12, wherein the grounding bars and the leads are located on a first plane, the die pad is located on a second plane, and the first plane and the second plane are parallels.

18. The chip package as claimed in claim 12, wherein the leads are located on a first plane, the grounding bars are located on a second plane, the die pad is located on a third plane, the first plane, the second plane and the third plane are parallels, and the second plane is located between the first plane and the third plane.

19. The chip package as claimed in claim 12, wherein the die pad, the grounding bars and the leads are coplanar.

20. The chip package as claimed in claim 12, wherein each of the grounding bars and the die pad respectively have a first indentation and a second indentation facing each other at their adjacent sides.

21. The chip package as claimed in claim 12, wherein each of the grounding bars has at least a through hole or an indentation.

22. The chip package as claimed in claim 12, wherein the die pad is quadrangular, the grounding bars respectively lie along four sides of the die pad, and the connecting bars comprise four connecting bars respectively connected to four corners of the die pad.

* * * * *